(12) United States Patent
Arena et al.

(10) Patent No.: US 9,175,419 B2
(45) Date of Patent: Nov. 3, 2015

(54) APPARATUS FOR DELIVERING PRECURSOR GASES TO AN EPITAXIAL GROWTH SUBSTRATE

(75) Inventors: Chantal Arena, Mesa, AZ (US); Christiaan J. Werkhoven, Gilbert, AZ (US); Ronald Thomas Bertram, Jr., Mesa, AZ (US); Ed Lindow, Scottsdale, AZ (US); Dennis L. Goodwin, Happy Jack, AZ (US)

(73) Assignee: SOITEC, Bernin (FR)

( * ) Notice: Subject to any disclaimer, the term of this patent is extended or adjusted under 35 U.S.C. 154(b) by 863 days.

(21) Appl. No.: 12/747,969

(22) PCT Filed: Dec. 5, 2008

(86) PCT No.: PCT/US2008/085715
§ 371 (c)(1),
(2), (4) Date: Jun. 14, 2010

(87) PCT Pub. No.: WO2009/082608
PCT Pub. Date: Jul. 2, 2009

(65) Prior Publication Data
US 2010/0258053 A1 Oct. 14, 2010

Related U.S. Application Data

(60) Provisional application No. 61/015,524, filed on Dec. 20, 2007.

(51) Int. Cl.
*C23C 16/00* (2006.01)
*C30B 25/14* (2006.01)
*C23C 16/455* (2006.01)

(52) U.S. Cl.
CPC ............. *C30B 25/14* (2013.01); *C23C 16/4557* (2013.01); *C23C 16/45574* (2013.01); *C23C 16/45578* (2013.01); *Y10T 137/8593* (2015.04)

(58) Field of Classification Search
CPC ................................. C23C 16/45563–16/45578

USPC .................. 118/724, 715; 156/345.33–345.34
See application file for complete search history.

(56) References Cited

U.S. PATENT DOCUMENTS

| 4,369,031 A * | 1/1983 | Goldman et al. | 118/715 |
| 4,817,558 A * | 4/1989 | Itoh | 118/715 |

(Continued)

FOREIGN PATENT DOCUMENTS

| JP | 06-216030 A | 8/1994 |
| JP | 11-092940 A | 4/1999 |

(Continued)

OTHER PUBLICATIONS

U.S. Appl. No. 12/894,724, filed Sep. 30, 2010.

(Continued)

*Primary Examiner* — Gordon R Baldwin
*Assistant Examiner* — Charlee Bennett
(74) *Attorney, Agent, or Firm* — TraskBritt (57) ABSTRACT

This invention provides gas injector apparatus that extends into a growth chamber in order to provide more accurate delivery of thermalized precursor gases. The improved injector can distribute heated precursor gases into a growth chamber in flows that are spatially separated from each other up until they impinge on a growth substrate and that have volumes adequate for high-volume manufacture. Importantly, the improved injector is sized and configured so that it can fit into existing commercial growth chambers without hindering the operation of mechanical and robot substrate-handling equipment used with such chambers. This invention is useful for the high-volume growth of numerous elemental and compound semiconductors, and particularly useful for the high-volume growth of Group III-V compounds and GaN.

12 Claims, 8 Drawing Sheets

(56) References Cited

U.S. PATENT DOCUMENTS

| | | | |
|---|---|---|---|
| 5,340,401 A * | 8/1994 | Cann | 118/725 |
| 5,781,693 A * | 7/1998 | Ballance et al. | 392/416 |
| 6,460,482 B1 * | 10/2002 | Kuibira et al. | 118/723 R |
| 6,861,321 B2 * | 3/2005 | Keeton et al. | 438/308 |
| 2001/0047764 A1 | 12/2001 | Cook et al. | 118/730 |
| 2004/0129215 A1 | 7/2004 | Kaeppeler et al. | 118/715 |
| 2004/0216668 A1 * | 11/2004 | Lindfors et al. | 118/715 |
| 2005/0205015 A1 * | 9/2005 | Sasaki et al. | 118/723 MA |
| 2005/0252449 A1 * | 11/2005 | Nguyen et al. | 118/715 |
| 2005/0271814 A1 * | 12/2005 | Chang et al. | 427/248.1 |
| 2006/0021574 A1 * | 2/2006 | Armour et al. | 118/715 |
| 2006/0075966 A1 * | 4/2006 | Chen et al. | 118/723 E |
| 2006/0086319 A1 * | 4/2006 | Kasai et al. | 118/715 |
| 2009/0178611 A1 | 7/2009 | Arena et al. | 117/99 |

FOREIGN PATENT DOCUMENTS

| | | | |
|---|---|---|---|
| JP | 2000228366 A * | 8/2000 | |
| JP | 2002-003229 A | | 1/2002 |
| WO | WO 02/23964 A1 | | 3/2002 |
| WO | WO 2006/020424 A2 | | 2/2006 |
| WO | WO2007/026889 A1 | | 3/2007 |
| WO | WO 2010/101715 A1 | | 9/2010 |

OTHER PUBLICATIONS

U.S. Appl. No. 13/145,290, filed Jul. 19, 2011.

U.S. Appl. No. 61/526,143, filed Aug. 22, 2011.

International Search Report and Written Opinion of the International Searching Authority, Application No. PCT/US2008/085715, mailed Mar. 4, 2009.

International Preliminary Report on Patentability for International Application No. PCT/US2008/085715 dated Jun. 22, 2010, 7 pages.

Korean Office Action for Korean Application No. 10-2010-7015883 dated Oct. 20, 2014, 4 pages.

* cited by examiner

APPARATUS FOR DELIVERING PRECURSOR GASES TO AN EPITAXIAL GROWTH SUBSTRATE

CROSS-REFERENCE TO RELATED APPLICATIONS

This application is a national phase entry under 35 U.S.C. §371 of International Patent Application PCT/IB2008/085715, filed Dec. 5, 2008, designating the United States of America and published in English as International Patent Publication WO 2009/082608 A1 on Jul. 2, 2009, which claims the benefit under Article 8 of the Patent Cooperation Treaty and under 35 U.S.C. §119(e) to U.S. Provisional Patent Application Ser. No. 61/015,524, filed Dec. 20, 2007, the disclosure of each of which is hereby incorporated herein in its entirety by this reference.

TECHNICAL FIELD

This disclosure relates to gas-phase epitaxial growth equipment and, in particular, provides an apparatus for delivering and heating precursor gases into an epitaxial growth chamber. This disclosure is particularly useful in equipment for the high-volume growth of GaN.

BACKGROUND

Halide (or hydride) vapor phase epitaxy (HVPE) of GaN and of other Group III-V compounds has known problems that result in an inefficient conversion of the precursor gases to GaN at the substrate. One problem relates to the temperature of precursor gases. In the case of GaN, if the entry temperature of the $GaCl_3$ and $NH_3$ is less than about 850° C., undesirable $GaCl_3:NH_3$ complexes may form that can limit the desired direct reaction between $GaCl_3$ and $NH_3$ to form GaN. A further problem arises if the precursor gases mix prematurely prior to their coming into contact in the immediate vicinity of the substrate. Premature mixing of the precursor gases can result in unwanted gas phase reaction byproducts and the production of particulates within the reactor, both of which can lead to a decrease in product quality.

A further problem arises from undesired deposition on the interior walls of a growth chamber. In the case of GaN, the undesirable deposition occurs since the Ga containing precursors, e.g., GaCl or $GaCl_3$, condense from the vapor phase at relatively low temperatures (generally less than 500° C.) and, therefore, areas of the reactor that are not maintained at a temperature above the vaporization zone can become coated. Over time, this unwanted material can build up to the extent of resulting in inefficient heating of the chamber as well as to production of quality-decreasing particulates.

Therefore, the prior art of Group III-V compound growth can benefit from apparatus that improve the thermalization and the delivery of precursor gases into a growth chamber. Such improvements will result in a more efficient utilization of precursor gases with associated cost reduction. However, such apparatus has not been available, at least because the physical space in growth chambers suitable for commercial production is very limited and the addition of further apparatus can compromise the effectiveness of mechanical substrate transfer systems or can be limited by available clearances for, e.g., inlet and exhaust lines.

DISCLOSURE

This disclosure provides gas injector apparatus that extends horizontally into a growth chamber in order to provide more accurate delivery of thermalized precursor gases. The improved injector can distribute heated precursor gases into a growth chamber in flows that are spatially separated from each other up until they impinge on a growth substrate. The flows are delivered with volumes adequate for high-volume manufacture. Importantly, the improved injector is sized and configured so that it can fit into many existing commercial growth chambers without hindering the operation of mechanical and robot substrate-handling equipment used with such chambers. This disclosure is useful for the high-volume growth of numerous elemental and compound semiconductors, and particularly useful for the high-volume growth of Group III-V compounds and GaN.

In preferred embodiments, the disclosure provides an ultra compact, ultra thin, precursor-heating injector that can be introduced in a restricted space above a substrate, while leaving adequate access for the wafer load/unload mechanism. The injector can provide non-reactive gas streams for separation of the reactive, precursor gases. The injector can be formed by bonding one or more bondable materials that are able to withstand the corrosive conditions and high temperatures in epitaxial growth chambers. Suitable materials include refractory oxides, e.g., quartz, refractory carbides, e.g., silicon carbide, refractory nitrides, e.g., aluminum nitride, and similar materials. Channels can be formed in one or more layers of this material that, when sealed by further layers, form conduits for the flow of multiple gases spatially separated from one another. The channels can have various channel geometries and dimensions, various input ports, various output ports, and so forth. The channels can be cut by means known to those familiar in the art, e.g., including, but not limited to, wet etching, plasma etching, mechanical cutting, laser cutting, etc., and the entire apparatus can be completed by bonding the constituent layers together.

In preferred embodiments, channels and conduits are laid out in a serpentine arrangement. This and similar arrangements maximize channel length within the injector, therefore increasing the residence time of gases flowing within the injector. Such longer residence times permit the gas to be efficiently heated. Preferably, the injector is heated, e.g., by heat lamps, resistive/inductive heating, etc., which can be performed by reactor heating elements or heating elements independent of the reactor.

In preferred embodiments, one or more relatively non-reactive gas curtains can be integrated into the injector to prevent the premature mixing of precursor gases after exiting the injector. The addition of non-reactive gas flows adds the capability of keeping the reactive gases separate until they contact the substrate. Upon contacting the substrate, turbulence resulting from the high-temperature substrate will break the inert gas curtain, allowing the gases to react in the direct vicinity of the substrate. In addition to providing a division between reactive gases, non-reactive gas streams allow for optimization of gas flow over the growth wafer. The flow rate in the non-reactive gas streams can be used to optimize the mixing and residence time of the reactants over the growth wafer, increasing growth rate and film uniformity of the epitaxially grown layer.

More specifically, in preferred embodiments, the present disclosure provides injectors for distributing gaseous precursors into an epitaxial growth chamber. Such injectors include one or more conduits extending horizontally into the growth chamber from a proximal portion adjacent to a chamber wall to a distal portion in the vicinity of an epitaxial growth substrate present within the chamber. The proximal portion of the conduit that is adjacent to a chamber wall includes at least one opening for receiving a flow of gas; the distal portion that is in the vicinity of the substrate includes a plurality of ports for distributing the flow of gas into the chamber, preferably onto at least a portion of a face of the substrate. The injectors of the present invention can further include heat transfer means for improving the transfer of heat from the interior of the chamber to the injector apparatus. Such injectors preferably include a material resistant to conditions within the growth chamber and to conditions within the conduits, and have thicknesses from about 2 mm to about 8 mm.

These preferred embodiments can be planar. Planar embodiments can be constructed of two or more planar materials arranged horizontally within the growth chamber, at least one of the planar materials having one or more channels formed and being sealingly bonded to another planar material so as to seal the channels, thereby forming conduits. Each such conduit preferably extends from a proximal portion for receiving a flow of gas to a distal portion in the vicinity of a growth substrate within the chamber having a plurality of ports passing through at least one of the planar materials for distributing the flow of gas into the chamber.

In differing aspects, the conduits can have various structures. For example, a plurality of conduits can act to distribute a plurality of gases onto the face of the substrate. Further, at least two distal portions of such conduits can be configured into linear shapes that are arranged parallel to each other, or into at least partially circular shapes that are arranged concentrically to each other, or so that ports in the distal end of one conduit are arranged to lie adjacent to the ports of at least one other distal end. In the case of three or more conduits capable of distributing at least three gases, ports in their distal ends can be arranged so that the ports of one distal end are between the ports of the other two distal ends.

Further, conduit structures also include at least one conduit having a serpentine portion between the proximal portion and the distal portion, and also include two conduits spaced apart in the vertical direction without gas communication between the conduits. Such conduits can be formed by sealing at least two channels, with one channel spaced vertically and isolated from at least one other channel. Conduit structures also include conduits that cross one another, both without gas communication between the conduits and with gas communication through a port between the two conduits. In such conduits, gas can flow between the proximal portion of one conduit and the distal portion of the other conduit.

In preferred embodiments, the invention also provides epitaxial growth apparatus having an epitaxial growth chamber, with a growth substrate arranged within, and an injector apparatus of this invention that is arranged to distribute a plurality of gases onto a face of the growth substrate. Such growth chambers also preferably include radiant elements for heating materials within the growth chamber, the growth chamber being at least partially transparent to the radiation emitted by the radiant elements, while the injector apparatus comprises a material at least partially absorbent, such material preferably being an integral part of the injector apparatus. Such absorbent material can be planar and in contact with, or in the proximity of, the gas-carrying portion of the injector apparatus.

In further embodiments, the epitaxial growth apparatus can also include a loading/unloading port and a loading/unloading mechanism that enters into and exits from the growth chamber through the loading/unloading port in order to place growth substrates into (and to remove growth substrates from) the growth chamber. In such epitaxial growth apparatus, the injector of this disclosure is preferably sized, configured and arranged within the growth chamber so as not to hinder the loading/unloading mechanism. A growth chamber can also include additional gas ports for establishing a cross-flow of gas within the chamber. In a preferred application of the epitaxial growth apparatus of this disclosure having an injector capable of distributing three gases, $NH_3$ and $GaCl_3$ are distributed through the ports of the outer distal ends and a non-reactive gas is distributed through the ports of the inner distal end.

Further aspects and details and alternate combinations of the elements of this disclosure will be apparent from the following detailed description and are also within the scope of the applicants' disclosure.

BRIEF DESCRIPTION OF THE DRAWINGS

The present disclosure may be understood more fully by reference to the following detailed description of the preferred embodiment of the present disclosure, illustrative examples of specific embodiments of the disclosure, and the appended figures in which.

DETAILED DESCRIPTION

Preferred embodiments of the interior injector apparatus of this disclosure are now described. Headings are used herein for clarity only and without any intended limitation.

Figure 1A:
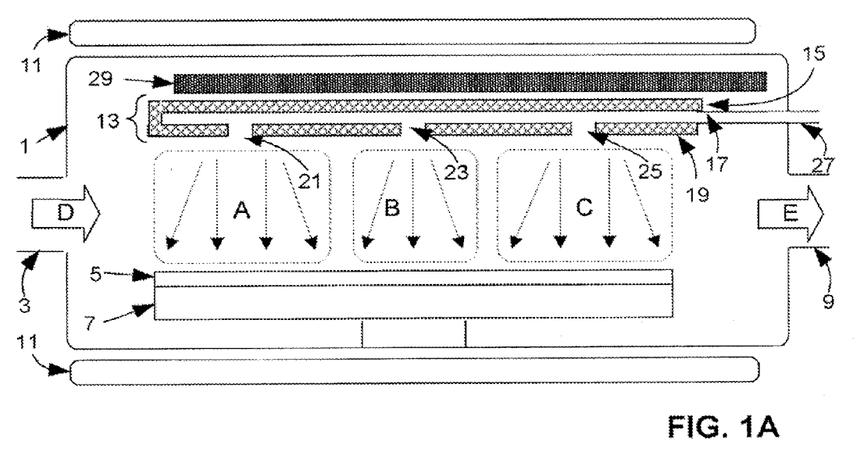
FIGS. 1A-1D illustrate in exemplary fashion interior injectors and patterns of conduit ports.
Figure 1B:
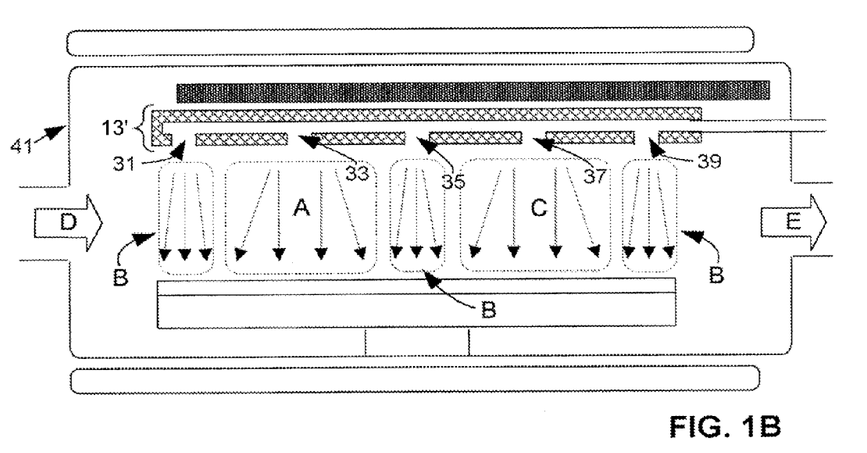

FIGS. 1A and 1B schematically illustrate embodiments of the interior injection apparatus of this disclosure. For clarity, reference numbers appearing in FIG. 1A that identify features also appearing in FIG. 1B are not repeated in the latter figure. As illustrated in these figures, interior injector 13 of this disclosure is arranged in the interior of epitaxial growth chamber 1, which can be pre-existing or designed for use with this disclosure. In either case, the growth chamber has certain routine features that are illustrated in FIGS. 1A and 1B and are now briefly described.

First, the growth chamber 1 is sized and configured so that it can include in its interior at least one epitaxial growth substrate 5 and at least one interior injection apparatus 13 of this disclosure. Otherwise, it can have various configurations and sizes, for example, a horizontal cross-section that can be rectangular, circular, or other shape, upper and lower surfaces that can be shaped, e.g., planar, domed, and other configuration options. It has at least one exhaust port 9 through which spent gases E flow from the chamber. Optionally, it can have additional injector ports, beyond those provided by interior injector 13, through which various process gases can be introduced into the chamber, schematically illustrated as gas or gases D. These additional ports, schematically illustrated as port 3, can be of many configurations and arrangements known in the art. The growth chamber can be associated with routine components as susceptor 7, which can be rotatably-mounted, for supporting growth substrate 5.

The growth chamber 1 can also be associated with heating means 11, which can include: resistive elements heated by currents; radiant elements emitting radiation such as RF, infrared, visible light, UV, and the like; elements of other types; and combinations of heating elements of different types. In preferred embodiments, heating means 11 includes radiant elements, e.g., lamps, RF coils, and the like, emitting radiation to which the material of the growth chamber is at least partially transparent, and that, therefore, passes into the growth chamber 1 to directly heat those interior components that absorb the emitted radiation. More preferably and as illustrated in FIGS. 1A and 1B, the material of the growth chamber includes quartz, and the heating means includes heating lamps of the type known and used in semiconductor processing equipment that can be positioned above, or below, or both above and below, the growth chamber 1.

Turning now to the details of exemplary interior injection apparatus 13 illustrated in FIGS. 1A and 1B, it should be understood that this interior injector is schematically represented and is not intended to represent a practical embodiment. Instead, the illustration presents principal functional components and principal functional relationships that are not necessarily in any particular scale. Actual interior injectors can have the illustrated functional components in greater or lesser numbers and in different sizes and arrangements. With that understanding, interior injector apparatus 13 of this disclosure includes one or more conduits 17 interior to the injector that carry and distribute process gases into the growth chamber, usually in the vicinity of growth substrate 5. The injector with its conduits is not limited to the vicinity of a chamber wall or otherwise, but can extend freely into the body of the chamber interior. Process gases are introduced into distal portions of conduit 17 from ports, tubes, other injectors, and the like, all illustrated as port 27, that communicate with process-gas supplies usually exterior to the growth chamber. Introduced gases flow through the conduit 17 and are distributed into growth chamber 1 though a plurality of conduit ports (or conduit nozzles), e.g., conduit ports 21, 23, and 25, that communicate with conduit 17. Although technically inaccurate, for convenience and clarity, FIG. 1A illustrates that interior injector 13 distributes three types of gas, gas of type A, gas of type B, and gas of type C, through conduit ports 21, 23, and 25, respectively, but illustrates only a single conduit. It should be understood that in actual implementation, there will usually be a separate conduit for each type of gas.

Conduit 17 is illustrated as having a linear, planar (2D) arrangement within the growth chamber that is formed between top portion 15 and bottom portion 19. This is preferred when it is desired to minimize the transit time of gas through the conduit and to minimize the volume of the chamber occupied by the interior injector. Other conduit arrangements are possible. A planar serpentine arrangement (FIG. 3A) can be used when it is also preferred to minimize the volume of the chamber occupied by the interior injector but it is not necessary to minimize gas transit time. Such arrangements can even be used to maximize gas transit time. When space interior to the chamber is available, a conduit may also follow various 3D courses within the chamber. The conduit may be formed with a tube-like shape.

Conduit ports are preferably sized, arranged, grouped and spaced apart from the growth substrate so as to achieve a desired distribution of process gases across the growth substrate. Commonly, a uniform distribution of one or more process gases across the substrate face is desired, in which case, if the substrate is rotating, ports can be distributed substantially along a diameter of the substrate or, if the substrate is stationary, ports can be distributed substantially across the face of the substrate. The spatial density and diameter of conduit ports can range from a lesser number of larger ports more distantly spaced from the substrate to a greater number of smaller ports less distantly spaced from the substrate, with the latter configuration being preferred in most embodiments. For example, for a 300 mm growth substrate, the conduit ports are preferably spaced apart from the face of the growth substrate from about 10 mm to about 30 mm; and cross-sectional sizes of the conduit ports preferably range from about 0.01 mm to about 1.0 mm. Then, the spatial density of conduit ports is selected in view of characteristics of gas flow from the conduit ports to the susceptor, i.e., principally in view of the gas footprint or coverage area produced by a single conduit port on the substrate surface. Selection of particular parameters for the conduit port arrangement can be made from knowledge of known gas flow characteristics, and estimated parameters can be refined by routine experiment.

Further, when multiple gases are being distributed through the conduit ports, the relative spatial arrangement of the ports for each of the gases depends, at least in part, on whether the multiple gases are preferably kept separate prior to impinging on the substrate, or on whether mixing of the gas flows is acceptable prior to impinging on the substrate. In the former case, ports for each gas are preferably spatially segregated into separate groups and/or intervening ports for a third gas are provided, which is selected to be non-reactive gas and capable of acting as a "curtain" between the gases to be kept from mixing. In the latter case, ports for the different gases can be arranged with fewer constraints.

FIG. 1A illustrates an exemplary spacing, sizing, arrangement and grouping of conduit ports. Here, the ports are sized and spaced from the growth substrate so that gases flow from each port so as to achieve a substantially uniform distribution upon impinging on the growth substrate. The footprint of each port is illustrated by the respective dotted rectangle. The density of the ports is such as to achieve the preferred distribution of the three gases across the entire growth substrate. The relative spatial arrangement of the ports is such as to separate gas A from gas C with a curtain of gas B. Of course, and in contrast with this exemplary figure, in a real implementation, ports 21, 23, and 25 would actually be groups of numerous, smaller ports. In some embodiments, inlet port 3 can admit additional process gases, such as a carrier gas D, which serves to sweep remaining amounts of un-reacted gases A, B, and C along with any reaction products into exhaust gas E flowing out through exhaust port 9.

Ports for precursor gases are integrated into an injection system along with optional ports for curtain gases, which can limit premature mixing of the precursor gases upon exiting the injection fixture. The addition of curtain gas flows adds the capability of keeping the reactive gases separate until they contact the substrate, where turbulence resulting from the high-temperature substrate will break the inert gas curtain, allowing the gases to mix and react, but only in the immediate vicinity of the substrate. Curtain gas streams can allow for optimization of gas flow over the growth substrate. Adjustment of curtain gas flow rates can be used to optimize mixing and residence times of the precursor gases over the growth substrate, thereby, growth rate and film uniformity of the epitaxially grown layer is improved. For example, gases A and C can be precursor gases. If gases A and C readily react, gas B can be a non-reactive carrier gas for forming a curtain between the precursor gases to prevent their reaction until they impinge on the growth substrate. In the case of GaN grown by HVPE processes, gases A and C can be $GaCl_3$ and $NH_3$, while gas B can be $N_2$ or $H_2$.

FIG. 1B illustrates another exemplary spacing, sizing, arrangement and grouping of ports of conduit 13' in growth chamber 41. Otherwise, conduit 13' and chamber 41 are similar to those of FIG. 1A. Here, four exemplary conduit ports (actually groups of a plurality of conduit ports) distribute three gases across a growth substrate. Assuming the growth substrate is being rotated by the susceptor, ports 33 and 37 distribute gas A and gas C, respectively, and are spaced from the growth substrate and arranged so that these gases achieve a preferred gas distribution across an annularly shaped portion of the substrate. Ports 31 and 39 distribute gas B in a thin, cylindrical footprint that shields the edges of the substrate from gases A and C. Port 35 distributes a curtain of gas B at the center of the substrate, which serves to separate gas A from gas C.

Figure 1C:
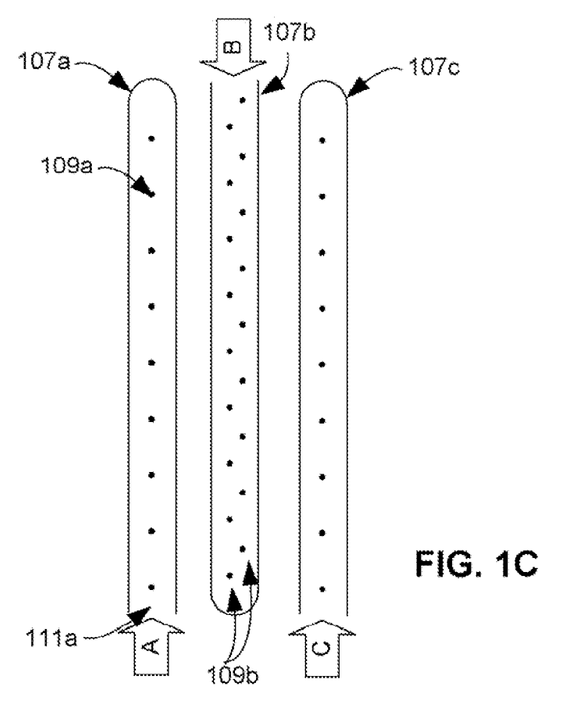
Figure 1D:
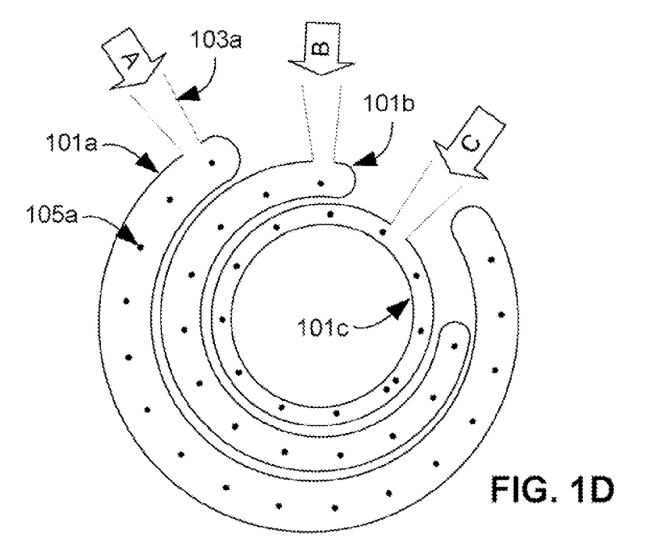

FIGS. 1C and 1D illustrate two exemplary 2D arrangements of the distal portions of conduits and of the conduit ports residing therein. This disclosure is not limited to these illustrated 2D arrangements, and includes a wide variety of other 2D spatial arrangements of conduits. For clarity and convenience, the more proximal portions of these conduits, extending from gas sources to the distal portions, are not here illustrated, but will be understood from the description above.

FIG. 1C illustrates an exemplary linear arrangement of distal portions and conduit ports capable of distributing three gases of one, two, or three different types, gas A, gas B, and gas C. These distal portions would be suitable for, e.g., a rotating substrate. Distal portion 107*a* extends from portion 111*a* into which gas A is delivered from the more proximal portion of this conduit. Gas A then exits distal portion 107*a* to the growth chamber through linearly arranged conduit ports 109*a*. Distal portion 107*c*, which distributes gas C, is similar to distal portion 107*a*. Distal portion 107*b* is also similar to distal portion 107*a* except that it distributes gas B into the growth chamber through two rows of linearly arranged conduit ports 109*b*. Generally, conduit ports can be variously arranged on the distal portions.

FIG. 1D illustrates an exemplary circular arrangement for distal portions and conduit ports, which would be suitable for, e.g., a stationary substrate. Here, outermost distal portion 101*a* is semicircularly shaped, receives gas A from a more proximal portion of the conduit through junction 103*a*, and distributes gas A into the growth chamber through semicircularly arranged conduit ports 105*a*. Middle distal portion 101*b*, similar to the outermost distal portion 101*a*, is semicircularly shaped, receives gas B through a junction to the more proximal portion of the conduit, and distributes this gas through semicircularly arranged conduit ports. The junction of the proximal portion to middle distal portion 101*b* passes through the gap in semicircular-shaped, outermost distal portion 101*a*, and the junction of the proximal portion to innermost distal portion 101*c* passes through the gap in semicircular-shaped, outermost distal portion 101*a* and through the gap in semicircular-shaped, middle distal portion 101*b*. In contrast to the outermost and middle distal portions, innermost distal portion 101*c* is here illustrated as circular shaped without gap. It receives gas C through a junction to the more proximal portion of the conduit and distributes this gas through circularly arranged conduit ports. Since no distal portion is interior to distal portion 101*c*, it itself need not have a gap to pass inward junction to further proximal portions.

The arrangement of FIG. 1D does not require conduits to cross one another and is, therefore, suitable for a planar 2D interior injector. If conduits can extend in the third dimension and cross one another, then all three distal portions can be circularly shaped without gaps, the junctions to one distal portion simply crossing over any intervening distal portions. For example, conduit crossing is possible in an interior injector with two or more planar layers of conduits if it is possible to form vias so that gas can pass between the layers. Crossing is also possible in interior injectors in which at least one conduit is an individual tube capable of extending in the third dimension; and crossing is possible in other structures.

Figure 2A:
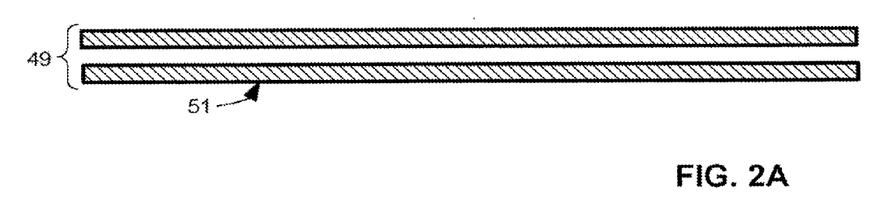
FIGS. 2A and 2B illustrate exemplary conduit construction.

Conduits can be formed in various structures. In some embodiments, conduits can be formed by a single, generally cylindrical-shaped piece of material. In other embodiments, conduits can be formed between a top portion 15 and a bottom portion 19 (FIG. 1A) with necessary side portions. Such conduits of these structures can extend in all three dimensions (3D) within a growth chamber. FIG. 2A illustrates a section of an intermediate portion (i.e., a portion between the proximal end and the distal end) of an exemplary conduit of the cylindrical-shaped embodiment. Here, material 51 is of a generally circular form defining within conduit 49. The cross-section of material 51 can be circular, oval, and the like.

However shaped, the cross-sectional dimensions are preferably such that injectors of this invention do not hinder the operation of mechanical and robot substrate-handling equipment but provide sufficient mechanical stability. In the case of common substrate-handling equipment and common chambers, the overall dimensions are less than generally from about 2 mm to about 8 mm. A preferred thickness is in the range of 5 mm.

Figure 2B:
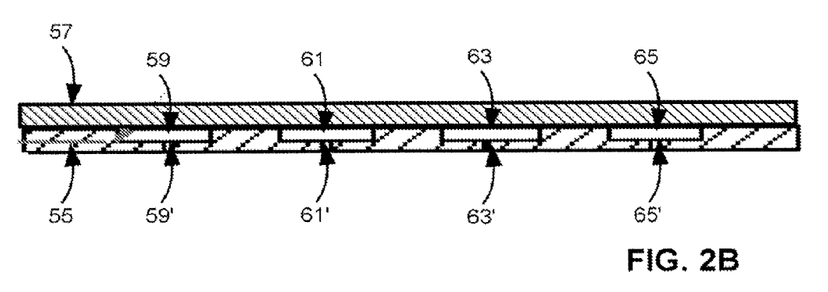

In preferred embodiments, conduits can be formed between two planar-shaped materials, and thereby can extend only in the two 2D planes defined by their component planar-shaped materials. FIG. 2B illustrates a section of a distal portion (i.e., a portion having conduit ports) of such an exemplary embodiment. Here, four conduits capable of carrying between one and four separate gases are formed as four channels, channels 59, 61, 63, and 65, in lower planar material 55, and are sealed by upper planar material 57. The channels can alternatively be formed in the upper planar material, can be formed in both planar materials, and can have other than rectangular cross-sections. The channels can each have linear or serpentine arrangements. The illustrated distal portion includes conduit ports 59', 61', 63', and 65', which communicate with conduits 59, 61, 63, and 65, respectively. Materials 55 and 57 can be the same or different, are preferably bondable together, and are preferably resistant to conditions in the growth chamber.

Further planar embodiments can have two or more layers of channels defining conduits that can cross one another and that can carry additional gases. For example, non-overlapping channels can be formed in an upper planar material and in a lower planar material so that, when the upper and lower materials are bonded together, two layers of conduits are formed. For another example, three or more planar-shaped materials, two or more of which have channels, can be bonded together so that two or more layers of channels are formed. In particular, a central planar material can have channels in its upper and lower surfaces, which are sealed by bonding top and bottom planar materials to both surfaces of the central planar material. Further, embodiments of such multilayer planar embodiments can have openings between the channels in different layers, which act like "vias." Thereby, a single conduit can pass from layer to layer in the third dimension. Such further embodiments allow an interior injector to distribute multiple gases to multiple groups of conduit ports in ways not limited by the geometric restrictions of a single layer of 2D channels.

Interior injector assemblies are formed from materials able to withstand both the high temperatures in growth chambers and the reactive chemical environment arising from the gases carried within the conduits and the gases otherwise in the interior of the growth chamber. Preferred materials include quartz, silicon carbide, aluminum nitride, and other similar refractory materials. Channels can be cut in the material by wet etching, plasma etching, mechanical cutting, laser cutting, or by other means known in the art. Materials can be bonded using wafer bonding methods also known in the arts. The interior and exterior dimensions are preferably from about 1 mm to about 8 mm; the conduit ports are preferably from about 0.01 mm to about 1 mm.

Figure 3A:
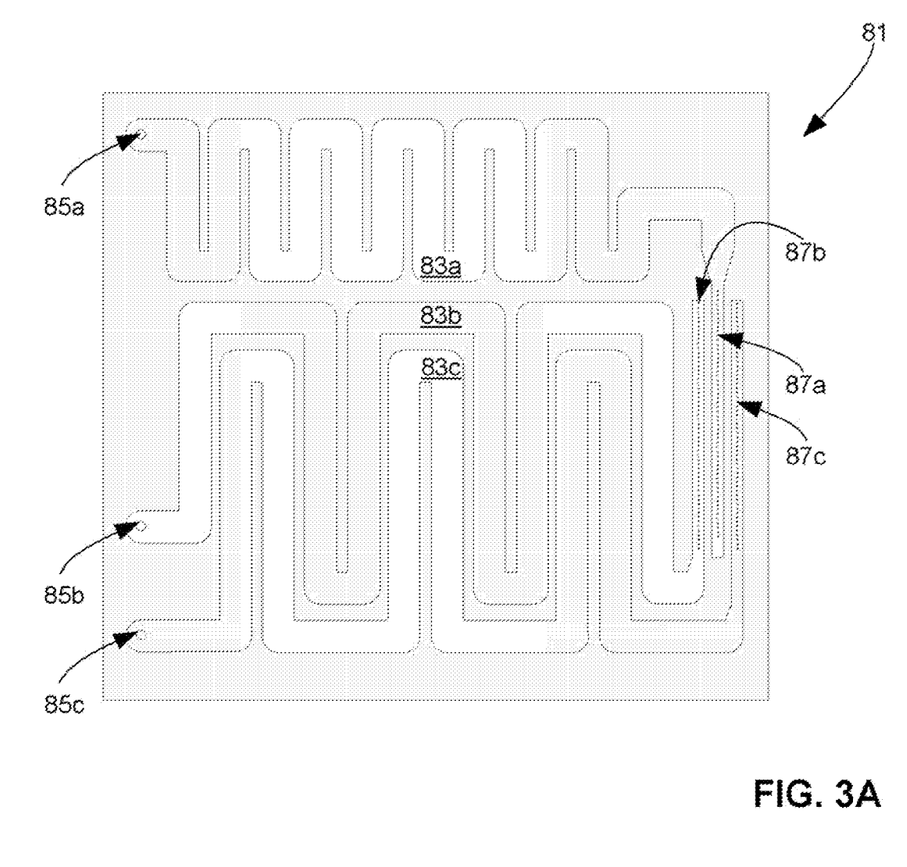
FIGS. 3A-3C illustrate an exemplary planar interior injector.
Figure 3B:
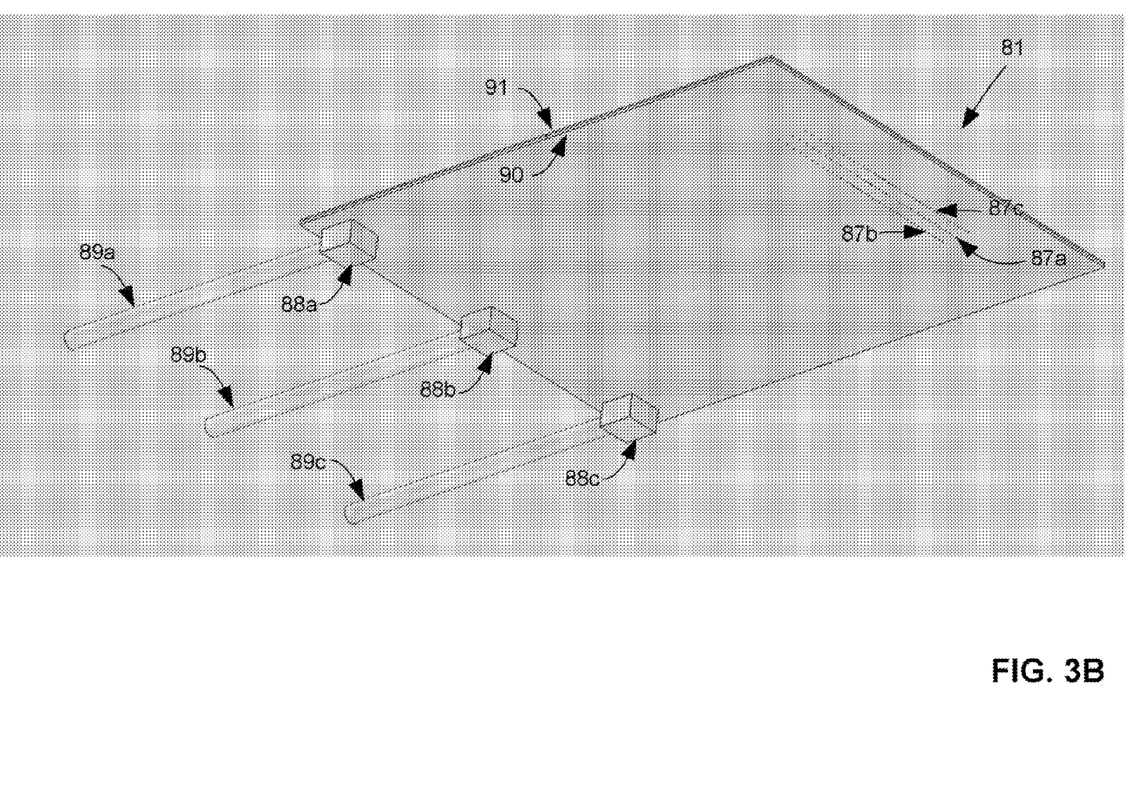
Figure 3C:
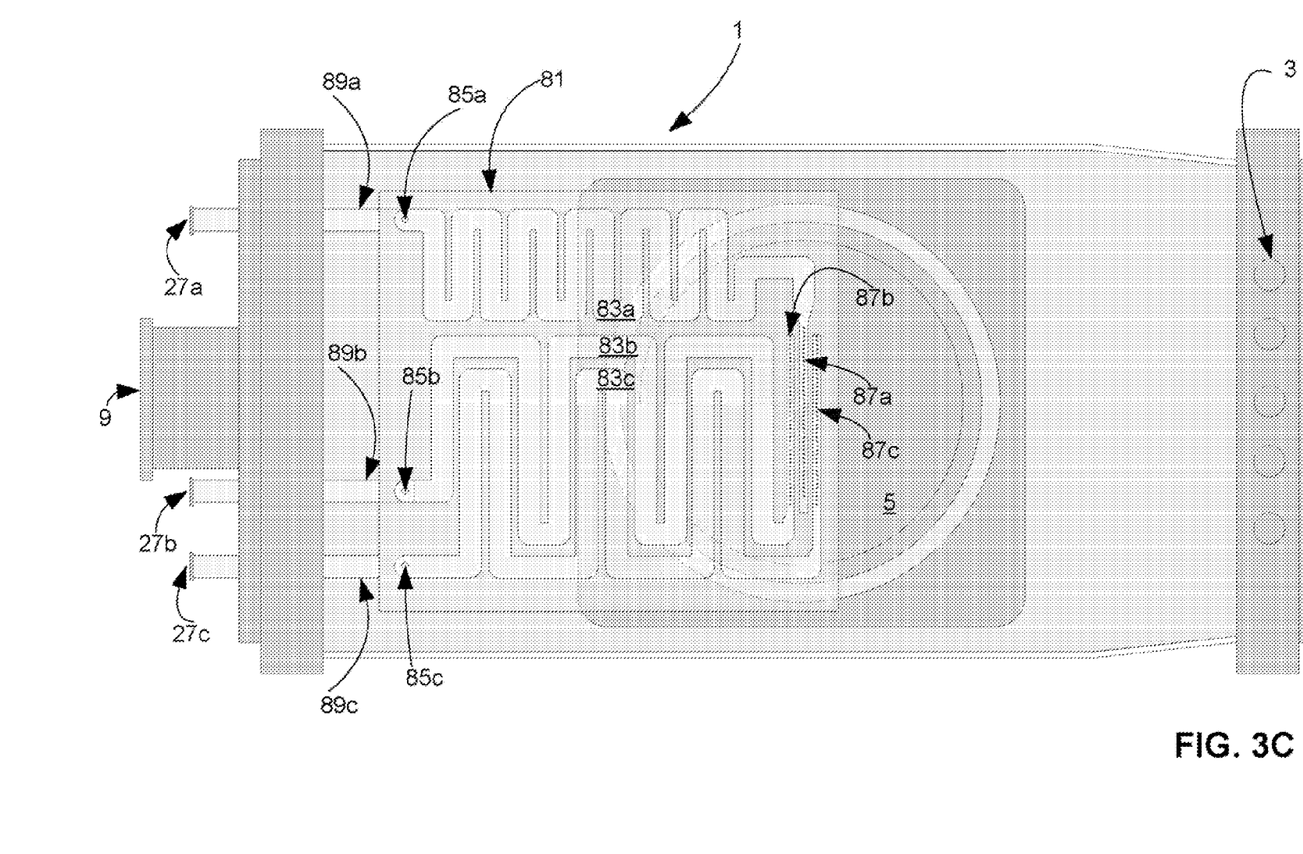

FIGS. 3A-3C illustrate a preferred embodiment of interior injector 81, which is structured in a relatively thin, planar-like shape having a single layer of conduits lying in the plane of the injector and leading to three linear and parallel arrays of conduit ports. Interior injector 81 can be considered as one non-limiting embodiment of the interior injector schematically illustrated in FIG. 1A. FIG. 3A presents a plan view of this embodiment. Interior injector 81 has three conduits 83a, 83b, and 83c, which are formed as sealed channels in planar materials and that follow a serpentine course from conduit inlets to three pluralities of linearly arranged conduit ports. Specifically, channel 83a (83b and 83c) conveys gas from conduit inlet 85a (85b and 85c, respectively) to a linear array of conduit ports 87a (87b and 87c, respectively). The serpentine course of the conduits lengthens gas transit time through the conduits, a feature useful in connection with a further preferred embodiment of this invention described subsequently with respect to FIG. 5.

FIG. 3B presents an oblique view of the surface of injector 81 through which open the conduit ports. It is apparent here that this injector is made by bonding thin, planar material 90 to thin, planar material 91 (materials 90 and 91 being the same or different) to form a structure with a thickness of from about 2 mm to about 8 mm and preferably about 5 mm. The conduits illustrated in FIG. 3A can be formed as channels in one or both of materials 90 and 91, and distribute one or more gases into a growth chamber through arrays of conduit ports 87a, 87b, and 87c, which are typically in the vicinity of a growth substrate. Junction blocks 88a, 88b, 88c couple the gases that are conducted through intermediate tubes 89a, 89b, and 89c, respectively, from (usually exterior) gas sources to conduit inlets 85a, 85b, and 85c (FIG. 3A), respectively.

FIG. 3C presents a plan view of an arrangement of interior injector 81 placed in growth chamber 1. Note that growth chamber elements common to both FIG. 1A and FIG. 3C are identified with the same reference numbers in both figures. Intermediate tubes 89a, 89b, and 89c link gas ports 27a, 27b, and 27c, respectively, external to the growth chamber to the conduit inlets 85a, 85b, and 85c, respectively (through the junction blocks shown in FIG. 3B). Conduits 83a, 83b, and 83c in planar interior injector 81 then link conduit inlets 85a, 85b, and 85c to conduit ports 87a, 87b, and 87c, respectively, positioned over the center of a susceptor with growth substrate 5. Thereby, a complete path for gases is established from gas sources external to the growth chamber to an array of multiple gas ports in the vicinity of a growth substrate. Gases exhaust from the growth chamber through exhaust port 9. Additional gas ports 3 can establish flows of one or more gases through the growth chamber across the growth substrate. Preferably, gas flows in interior injector 81 counter to any cross-flows of gas introduced by ports 3.

Figure 4:
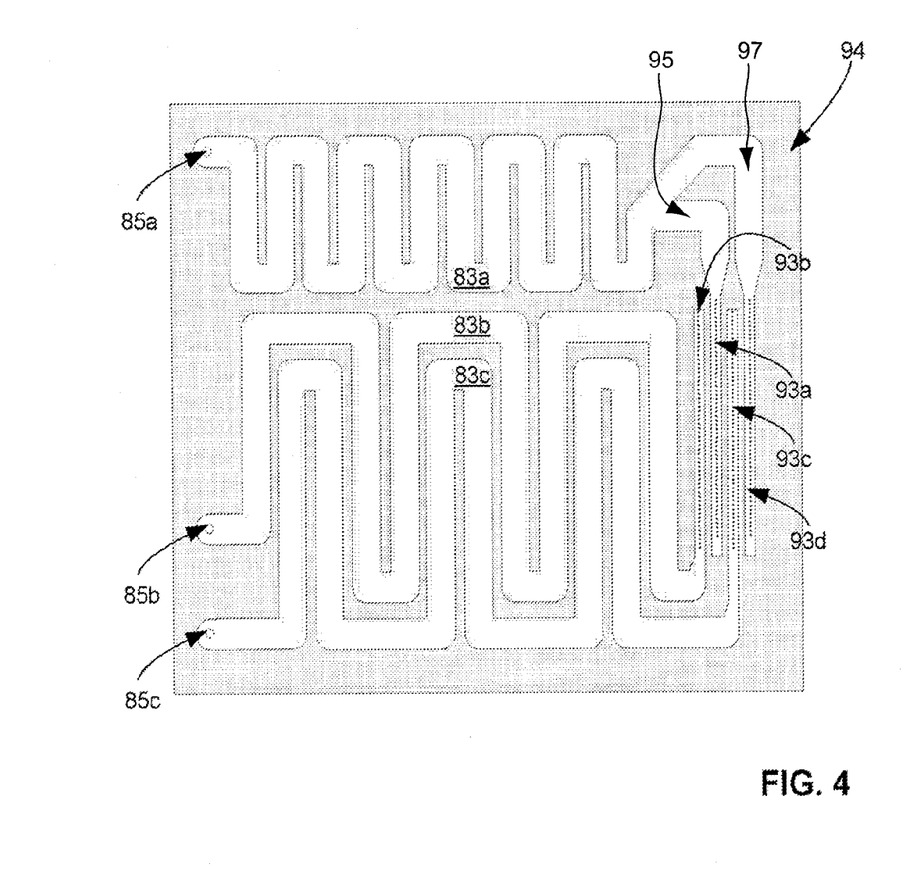
FIG. 4 illustrates another exemplary planar interior injector.

FIG. 4 presents a plan view of one non-limiting embodiment of interior injector schematically illustrated in FIG. 1B. Injector 94 is also here structured in a relatively thin, planar shape, having conduits running in the plane of the injector, and having four linear, parallel arrays of conduit ports. Interior injector 94, like interior injector 81, has three conduits 83a, 83b, and 83c, which are formed as sealed channels in planar materials and that follow a serpentine course from conduit inlets 85a, 85b and 85c, respectively, to four pluralities of linearly arranged conduit ports. Specifically, channel 83b (83c) conveys gas to a linear array of conduit ports 93b (93c, respectively). However, conduit 83a illustrates one alternative arrangement in that the distal portion of conduit 83a divides into sub-conduits 95 and 97, which convey gas to linear arrays of conduit ports 93a and 93d, respectively. Thus, gas from single inlet port 85a is conveyed to outlet ports arrays 93a and 93d and distributed into the growth chamber from both these arrays to form a curtain enclosing the gas distributed from conduit port array 93c. The serpentine course of the three conduits lengthens gas transit time through the conduits, a feature useful in connection with a further preferred embodiment of this invention described subsequently with respect to FIG. 5.

A further significant feature of the present invention is the possibility of heating gases as they are conveyed through an interior injector of this invention prior to their distribution into a growth chamber. Heating precursor gases can be advantageous to prevent their premature reaction before impinging on an intended growth substrate. It is known that premature reactions can, e.g., degrade the quality of the epitaxial layer being grown, can consume valuable reagent gases, and the like. For example, in the case of GaN growth by HVPE processes, the GaCl (or GaCl$_3$) and the NH$_3$ can, at lower temperatures, form complexes that are resistant to conversion into GaN. Since an interior injector is necessarily exposed to the higher temperatures within a growth chamber, gases flowing through the interior injector will necessarily be routinely heated to a degree. However, in many embodiments, it is preferred to include specific features that promote heating of gases flowing in an interior injector of this invention.

One significant design feature that can promote the heating of gases flowing in conduits within an injector concerns the layout of the gas conduits. Preferably, conduit layout should be such as to lengthen the residence time of gases within the interior injector fixture, since longer residence times provide additional time for heat transfer to the gases. On the other hand, it is desirable that gas flow rates not be significantly limited nor gas pressures significantly elevated. Accordingly, it is preferred that conduits be made longer and not narrower. In the case of interior injectors having channels formed between bonded planar materials, longer conduits can follow a serpentine path. Many patterns of serpentine paths are suitable for this invention. One preferred pattern, illustrated in FIGS. 3A-3C and 4, is for the channels to follow a tight wave-like path. Other geometric patterns are widely known that can also lead to longer conduits.

A further feature that can promote gas heating concerns heat transfer to the interior injector fixture. Many techniques known in the art can improve transfer of ambient heat to a fixture, and the suitability of a particular one of these techniques can depend on, e.g., the type of heating means employed to heat the chamber, the expected gas pressure within the growth chamber, and the like. For example, heat can be transferred by convection and conduction of the gases internal to the growth chamber, and these processes improve with higher gas pressure. Also, heat conduction can be improved by placement near a high-temperature object, by conductive fins or other conductive elements, and the like.

However, in preferred embodiments, the growth chamber is heated by radiant elements, and the emitted radiation is captured to heat an interior injector. For example, in the case where the interior injector includes materials that absorb the emitted radiation, at least to a degree, e.g., SiC, the interior injector will be directly heated by the emitted radiation that also heats the susceptor to growth temperatures. Thereby, gases flowing can be more efficiently heated to near growth temperature. On the other hand, if the materials of the interior injector are substantially transparent to the emitted radiation, e.g., quartz, a further radiation-absorbing element material can be configured and sized to be in contact with, or in close proximity to, the interior injector. Thereby, this absorbing element is heated by the emitted radiation and, in turn, heats the interior injector.

This latter preferred heat transfer technique is illustrated in FIGS. 1A and 1B and is now described. Planar material plate 29 comprises such an absorbing element suitable for heating a planar interior injector. In many embodiments, heating means 11 will include high-intensity lamps, and growth chamber 1 will be formed at least partially of a material transparent to the radiation emitted by the lamps. Plate 29 can then preferably be a highly absorbing planar material that is resistant to growth chamber conditions, e.g., SiC, arranged to be in contact with, or in close proximity to, interior injector 13. Plate 29 can absorb radiation from the heat lamps and reach a temperature similar to the epitaxial growth temperature reached by the substrate. Thereby, the interior injector and gases flowing therein can be more efficiently heated to near growth temperature.

Figure 5:
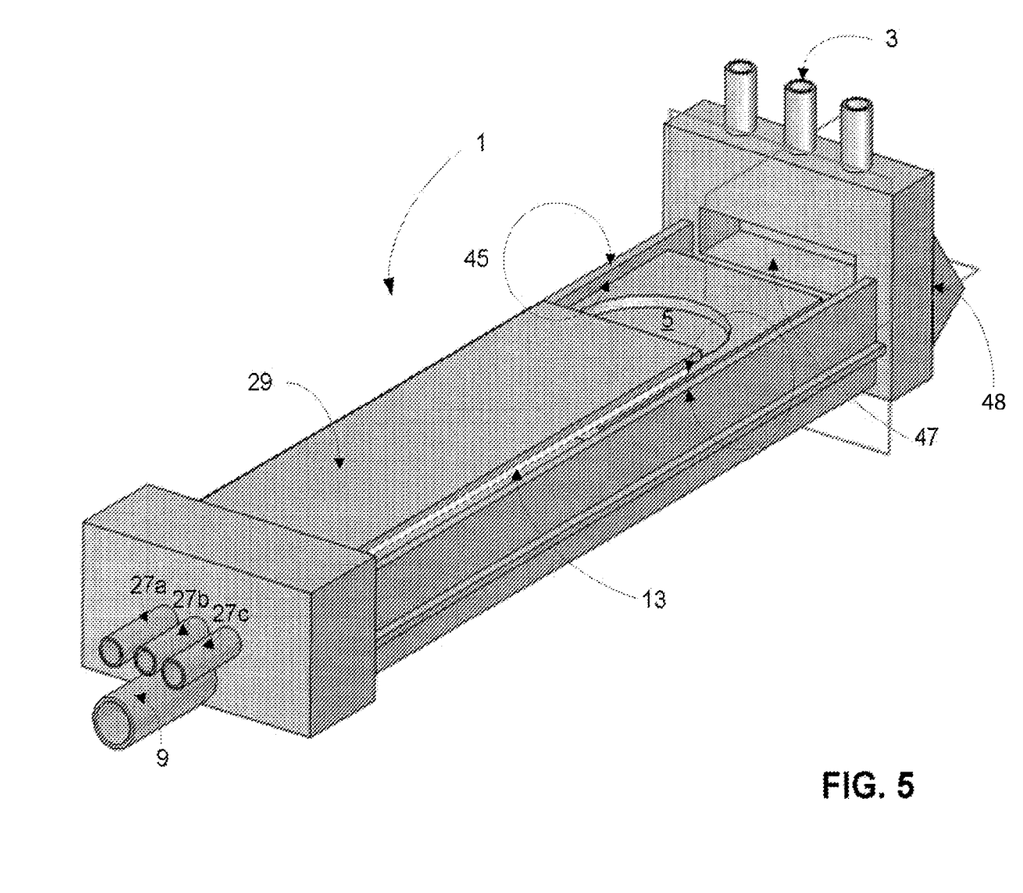
FIG. 5 illustrates in exemplary fashion a heated interior injector.

FIG. 5 illustrates exemplary heated interior injector within growth chamber 1. As before, gases exhaust though exhaust port 9, and ports 3 can admit additional gas flows through the length of growth chamber 1. Ports 27a, 27b, 27c, as in FIG. 3C, are for admitting the gases to be distributed by the interior injector. In one embodiment, the interior injector fixture includes upper absorbing plate 29 in contact with or in close proximity to underlying interior injector 13. In another embodiment, absorbing plate or material 29 is an integral component of interior injector 13 (such as an upper plate of a planar injector). Absorbing plate or material 29 is placed so as to be directly exposed to the heating lamps over growth chamber 1 (not illustrated), and interior injector 13, if separate from plate or material 29, is placed to be in contact with, or in close proximity to, plate or material 29. The interior injector is also placed so that its conduit ports are over growth substrate 5. The growth substrate is only partially covered by the absorbing portion of the injector fixture so that it may also be directly heated by the heat lamps. As illustrated, the entire surface of plate 29 is absorbing; however, in other embodiments, the absorbing portion of plate 29 can be only a portion of its surface. For example, some or all of the plate over the growth substrate can be more or less transparent, e.g., to better heat the growth substrate.

FIG. 5 illustrates a further aspect of this invention. In many growth chambers, loading and unloading is performed by an automatic mechanism, e.g., by a Bernoulli wand, that enters and exits the growth chamber through a gated loading/unloading port. For example, growth chamber 1 is such a chamber and can be loaded and unloaded through port 47 with controllable gate 48. Further, in growth chamber 1, as in many such growth chambers, the vertical clearance above the growth substrate that is available to the loading/unloading mechanism, represented here by double arrow 45, is limited. Therefore, the interior injector fixture, that is, the interior injector and any overlying heating plate, is preferably sufficiently thin so that the remaining vertical clearance above the growth substrate that is available to the loading/unloading mechanism, represented here by double arrow 45, is not so limited as to hinder operation of this mechanism. For many growth chambers, a suitable total thickness of the injector fixture has been found to be less than about 8 mm, preferably less than about 5 mm, or more preferably less than about 2 mm.

EXAMPLE

For GaN grown by HVPE processes, an internal injector of this invention can be constructed from quartz with a SiC plate positioned above the injector to promote the heating of the injector and of the gases flowing therein. The SiC plate results in more efficient transfer of heat from the radiant heating source to the injection scheme. Precursors are $NH_3$ and $GaCl_3$: the $NH_3$ being flowed through the interior injector at a rate of about 1-5 SLM (standard liters per minute); and an $N_2$ carrier gas having entrained $GaCl_3$ also being flowed through the interior injector at a rate of about 1-5 SLM. In addition, further gases can be introduced through additional cross-flow input ports at flow rates between about 0 and about 50 SLM in order to better optimize the gas flow over the growth substrate. Interior injectors similar to the embodiments illustrated in FIGS. 3A-3C, 4, and 5 in the illustrated growth chambers are suitable for this application.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims. In the following (and in the application as a whole), headings and legends are used for clarity and convenience only. A number of references are cited herein, the entire disclosures of which are incorporated herein in their entirety by this reference for all purposes. Further, none of the cited references, regardless of how characterized above, is admitted as prior to the invention of the subject matter claimed herein.

What is claimed is:

1. An injector apparatus for distributing gaseous precursors into an epitaxial growth chamber comprising:
    two or more planar materials arranged horizontally within the growth chamber, at least one of the two or more planar materials having at least three channels formed therein, the two or more planar materials being sealingly bonded together so as to seal the at least three channels thereby forming at least three conduits, each of the at least three conduits having a plurality of ports passing through at least one of the two or more planar materials; and
    wherein:
        each of the at least three conduits extends horizontally into the epitaxial growth chamber from a proximal portion adjacent to a chamber sidewall to a distal portion in the vicinity of and adjacent to an epitaxial growth substrate present within the chamber;
        each of the at least three conduits has the proximal portion adjacent to the chamber sidewall and bearing at least one opening for receiving a flow of gas;
        each of the at least three conduits having the distal portion in the vicinity of the epitaxial growth substrate and bearing the plurality of ports for distributing the flow of gas into the epitaxial growth chamber;
        the plurality of ports in the distal portion of each of the at least three conduits is arranged to distribute the gas onto at least a portion of a face of the epitaxial growth substrate;
        the at least three distal portions of the at least three conduits are configured into linear shapes that are arranged parallel to each other or into at least partially circular shapes that are arranged concentrically to each other; and a first conduit, a second conduit and a third conduit are provided by the at least three conduits, each of which has the plurality of ports so as to provide a curtain of third gas from the third conduit between a first gas from the first conduit and a second gas from the second conduit.

2. The apparatus of claim 1 wherein the ports in the distal portion of at least one of the at least three conduits are arranged to distribute the gas onto at least a portion of a face of the substrate.

3. The apparatus of claim 2 where the at least three distal portions of the at least three conduits are configured into linear shapes that are arranged parallel to each other.

4. The apparatus of claim 2 wherein the at least three distal portions of the at least three conduits are configured into at least partially circular shapes that are arranged concentrically to each other.

5. An injector apparatus for distributing gaseous precursors into an epitaxial growth chamber comprising:

two or more planar materials arranged horizontally within the growth chamber, at least one of the planar materials having one or more channels formed therein, the two or more planar materials being sealingly bonded together so as to seal the channels thereby forming at least three conduits capable of distributing at least three different gases into the epitaxial growth chamber, each of the at least three conduits extending horizontally from a chamber sidewall into the epitaxial growth chamber from a proximal portion adjacent to the chamber sidewall to a distal portion in the vicinity of and adjacent to an epitaxial growth substrate present within the chamber, each conduit of the at least three conduits not having gas communication with the other conduits of the at least three conduits, wherein each of the proximal portions of the conduits follows a serpentine path up to each of the respective distal portions for heating gas flowing therein prior to delivery to the epitaxial growth substrate;

each of the at least three conduits having its proximal portion adjacent to the chamber sidewall and bearing at least one opening for receiving a flow of gas; and each of the at least three conduits having its distal portion in the vicinity of the substrate and bearing a plurality of ports for distributing the flow of gas onto the epitaxial growth substrate in the chamber;

wherein the distal portion of one conduit of the at least three conduits is configured to form a flowing gas curtain of non-reactive gas disposed between reactive gases flowing out from the distal portions of two other conduits of the at least three conduits such that mixing of the reactive gases is hindered until the reactive gases are located proximate the epitaxial growth substrate.

6. The apparatus of claim 5 wherein the at least three conduits are arranged so that the ports in the distal end of the one conduit are between the ports in the distal ends of the two other conduits.

7. The apparatus of claim 1 further comprising heat transfer means for improving the transfer of heat from the interior of the chamber to the injector apparatus.

8. The apparatus of claim 1 wherein the at least three conduits have a thickness between about 2 mm and about 8 mm and are made from a material resistant to conditions within the growth chamber and to conditions within the conduits.

9. The apparatus of claim 1 wherein at least one of the channels is spaced vertically and isolated from at least another of the channels so that at least two of the conduits are spaced apart in the vertical direction without gas communication between the at least two of the conduits.

10. The apparatus of claim 9 further comprising sources for the reactive gases and a source for the non-reactive gases, the sources for the reactive gases comprising sources of $GaCl_3$ and $NH_3$, the source for the non-reactive gas comprising a source of at least one of $N_2$ and $H_2$.

11. The apparatus of claim 1 wherein the injector apparatus is sized and configured and arranged within the epitaxial growth chamber so as not to interfere with a loading/unloading mechanism for the epitaxial growth chamber.

12. An injector apparatus for distributing gaseous precursors into an epitaxial growth chamber comprising:

two or more planar members arranged horizontally within the epitaxial growth chamber, at least one of the planar members having channels formed therein, the two or more planar members being bonded together so as to seal the channels, the channels defining at least three separate gas distribution conduits, each of the at least three conduits extending horizontally through the two or more planar members from a proximal location near a sidewall of the epitaxial growth chamber to a distal location near an epitaxial growth substrate present within the epitaxial growth chamber, each of the at least three conduits having at least one opening for receiving a flow of gas, each of the at least three conduits including a distal portion bearing a plurality of ports for distributing a flow of gas out from the distal portion and onto the epitaxial growth substrate in the epitaxial growth chamber;

wherein the distal portion of one conduit of the at least three conduits is configured to form a flowing gas curtain of non-reactive gas disposed between reactive gases flowing out from the distal portions of two other conduits of the at least three conduits such that mixing of the reactive gases is hindered until the reactive gases are located proximate the epitaxial growth substrate.

* * * * *